United States Patent [19]
Takemoto et al.

[11] 3,945,347
[45] Mar. 23, 1976

[54] METHOD OF MAKING INTEGRATED CIRCUITS

[75] Inventors: Toyoki Takemoto, Kyoto; Hiroshi Kuroda, Katano, both of Japan

[73] Assignee: Matsushita Electric Industrial Co., Ltd., Kadoma, Japan

[22] Filed: Oct. 16, 1973

[21] Appl. No.: 406,927

[30] Foreign Application Priority Data
Oct. 16, 1972  Japan............................ 47-104283

[52] U.S. Cl. ...................... 29/577; 29/578; 29/591; 29/580
[51] Int. Cl.[2]......................................... B01J 17/00
[58] Field of Search ............ 29/578, 591, 577, 580; 96/36.2

[56] References Cited
UNITED STATES PATENTS

| | | | |
|---|---|---|---|
| 3,138,744 | 6/1964 | Kilby | 29/578 |
| 3,160,534 | 12/1964 | Oroshnik | 29/578 |
| 3,266,127 | 8/1966 | Harding | 29/578 |
| 3,498,833 | 3/1970 | Lehrer | 29/578 |
| 3,747,200 | 7/1973 | Rutledge | 29/571 |
| 3,840,982 | 10/1974 | Schuster | 29/578 |

Primary Examiner—W. Tupman
Attorney, Agent, or Firm—Cushman, Darby & Cushman

[57] ABSTRACT

In a method of making integrated circuits, prior to vapor deposition of metal layers on an insulating layer for interconnection, each opening on the insulating layer is filled with an embedded metal layer in order to smoothen the surface to be vapor deposited and to avoid undesirable thin parts of the vapor deposited metal layer at the step between the lower part in the opening and the elevated part on the insulating layer. The filling of the embedded metal layer in each opening is made by a first step of coating a metal layer on the whole surface of the principal face of the semiconductor, which surface is coated by the insulating layer with specified openings and further by a photoresist layer which has been used for etching the insulating layer to form said openings and is left covering said insulating layer, and by the subsequent step of applying a photoresist removing liquid on the face to remove the photoresist layer and the part of metal layer still remaining on the photoresist layer.

7 Claims, 13 Drawing Figures

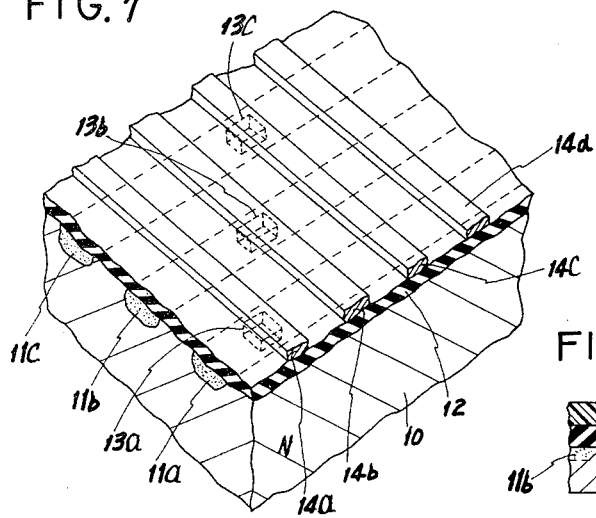
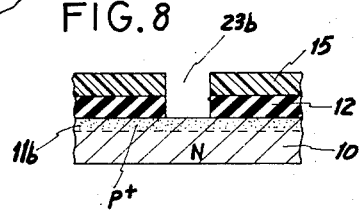
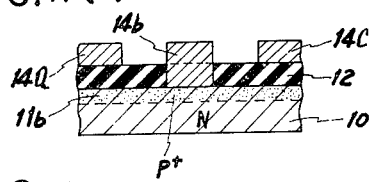
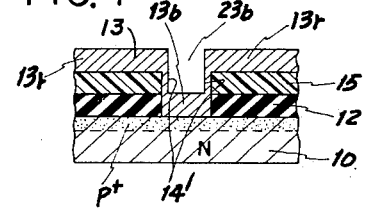
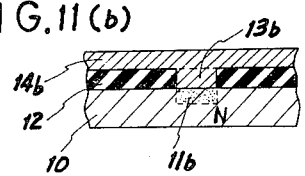
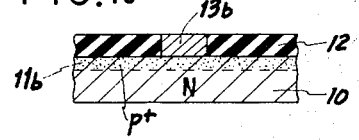
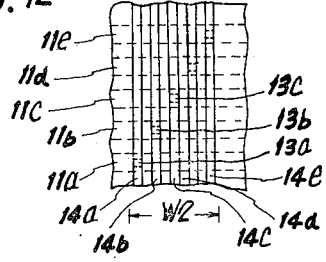

METHOD OF MAKING INTEGRATED CIRCUITS

BACKGROUND OF THE INVENTION

This invention relates to an improvement in the method of making integrated circuits, and especially an improved method of making interconnection metal strips, capable of reliable connection with narrower width strips. This invention purports to increase the reliability of interconnection as well as to decrease the area necessary for the interconnection of an integrated circuit.

The prior art method of making interconnection in metal-oxide-semiconductor (hereinafter referred to as MOS) integrated circuits (hereinafter referred to as ICs) is described with reference to FIGS. 1 to 6. In FIG. 1 which is a perspective view of a part of a conventional IC, wherein a semiconductor substrate 1 has a number of strip shaped diffused regions $2a$, $2b$, $2c$, . . . of P+ conductivity type on its upper face. An insulating layer 3 of silicon dioxide has openings $5a$, $5b$, $5c$, . . . on specified positions on the diffused regions $2a$, $2b$, $2c$, . . . On the insulating layer 3, a number of metal strips $4a$, $4b$, $4c$, . . . of, for instance, aluminum are provided by vapor deposition and subsequent masked etching in a manner that the direction of the metal strip makes a right angle to the direction of the strips of the diffused regions $2a$, $2b$, $2c$, . . . , so that the parts of the metal strips that are on the openings $5a$, $5b$, $5c$, . . . contact the surfaces of the diffused regions $2a$, $2b$, $2c$, . . . , for interconnection therewith.

The conventional method of making the above-mentioned IC is explained with reference to FIGS. 2 to 5, which show enlarged sections in various manufacturing steps of the part of the device of FIG. 1 that includes the opening $5b$.

An insulating layer, for instance, a silicon dioxide layer 3, is provided to coat a principal face of an N-type silicon substrate 1. The diffused regions $2a$, $2b$, $2c$, . . . of, for instance, P+ conductivity type, have been preliminarily formed in a specified pattern on the principal face. Then, by a known photochemical process, the insulating layer 3 is coated with a photoresist layer 6 of a specified pattern having holes on specified positions of the diffused regions, and the insulating layer 3 is treated with a known etchant, for instance, hydrogen peroxide solution. Accordingly, the parts of insulating layer 3 that are exposed through openings of the photoresist layer 6 are etched away to form openings $5b$, . . . , from which the P+ − type diffused regions $2b$, . . . of the semiconductor substrate 1 are exposed, as shown in FIG. 2.

Next, the photoresist layer 6 is removed by a known method, and then a metal layer 4 of, for instance, aluminum is vapor deposited into the openings $5b$, . . . and upon the insulating layer 3, as shown in FIG. 3.

Finally, the unnecessary parts of the metal layer 4 are removed by a known masked etching method, so as to form the metal strips $4a$, $4b$, $4c$, . . . of a specified pattern, as shown in FIG. 4. Thus, the metal strips, $4b$, . . . contact the diffused regions $2b$, . . . embedded in the openings $5b$, . . . , as shown in FIGS. 4, 5, and 6.

In the conventional IC made by the above-mentioned method, the metal part, which is in the opening $5b$ and is in contact with the semiconductor, is connected to the metal strip on the insulating layer 3 with thin step parts A around the brim of the opening $5b$. Since these thin step parts A are electrically and mechanically fragile, and are likely to be broken by an overcurrent, it has been necessary that the width of the metal strips $4a$, $4b$, $4c$, . . . be made wider, by the width (2T) of the two side paths $4b1$, $4b2$, than the width of the openings $5a$, $5b$, $5c$, . . . The side paths $4b1$ and $4b2$ are provided in order to form the connecting parts A in all of the sides of the openings $5b$, . . . , for the sake of a larger total cross section and doubling of the electric path between the metal in the opening and the metal on the insulating layer. Since the average width of a pair of side paths is about 2.5 to 5 microns for one metal strip, the area occupied by the side paths cannot be overlooked. Accordingly, it is an important consideration to dispense with such side paths for decreasing the size of IC. Moreover, conventional ICs are likely to show defects due to the above-mentioned breaks in the thin step parts A in their reliability tests in the actual manufacturing process, and therefore, a drastic improvement has been sought. Several measures have been proposed, for instance, to tilt, swing or rotate the substrate during the vapor deposition of the metal layer, in order to make oblique and thicken the thin step parts A between the metal in the opening and the metal on the insulating layer. However, such measures necessarily deform the section of the metal strip into a trapezoid and increase the width at the base of the metal strip, and moreover are liable to make the pattern of the metal inaccurate.

SUMMARY OF THE INVENTION

Accordingly, the object of the present invention is to dispense with the above-mentioned side paths $4b1$ and $4b2$, . . . of the metal strip $4b$ and to narrow the width of the metal strips of an IC in order to decrease the size of the IC.

Another object of the present invention is to improve the reliability of interconnection of the IC.

BRIEF EXPLANATION OF THE DRAWINGS

FIG. 7 is a perspective view of a part of an IC according to the present invention;

FIGS. 8, 9, 10, and 11(a) are enlarged sectional views of a part of the device of FIG. 7 for various steps of making the sectional planes being at right angles to the direction of the metal strips $14a$, $14b$, $14c$, . . . ;

FIG. 11(b) is an enlarged sectional view of the part shown in FIG. 11(a), its sectional plane being parallel to the direction of the metal strips $14a$, $14b$, $14c$, . . . , and FIG. 12 is a plan view showing the principal part of the IC shown in FIGS. 7 to 11(b).

Figure 1:
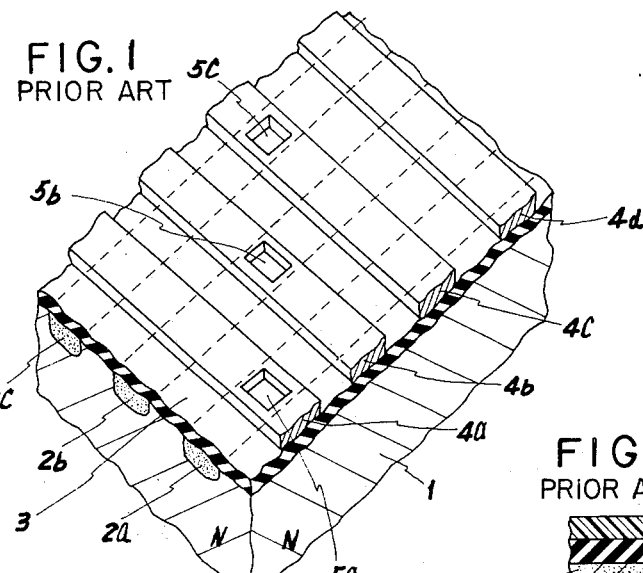
FIG. 1 is a perspective view of a part of a conventional IC.
Figure 2:
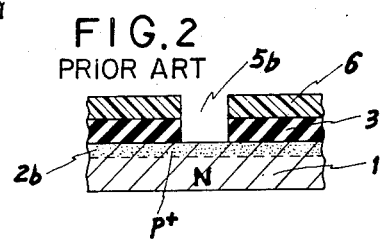
FIGS. 2, 3, and 4 are enlarged sectional views of a part of the device of FIG. 1, the sectional planes being at right angles to the direction of the metal strips $4a$, $4b$, $4c$, . . .
Figure 5:
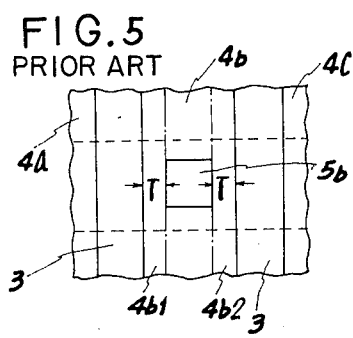
FIG. 5 is an enlarged plan view showing the part shown in FIGS. 2 to 4.
Figure 3:
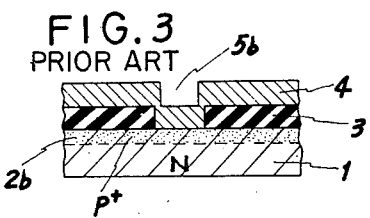
Figure 6:
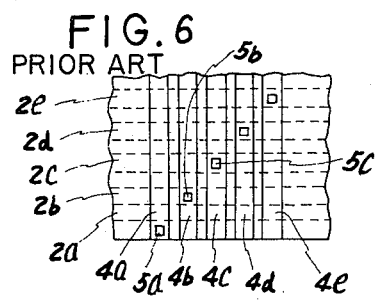
FIG. 6 is a plan view showing a principal part of the IC shown in the above-mentioned figures.
Figure 4:
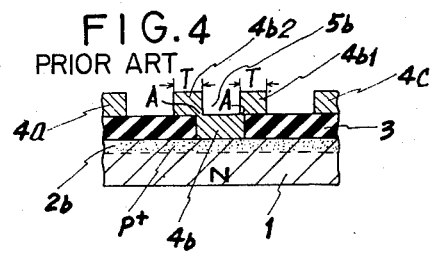

In these figures the sizes are not in exact proportion to the actual sizes, but are modified in some parts in order to show details.

DETAILED DESCRIPTION OF THE INVENTION

In FIG. 7, as one example, a part of a MOS-IC manufactured according to the present invention is shown.

The process of making the device of FIG. 7 is explained hereunder in reference to FIGS. 8 to 11(b).

An insulating layer 12, for instance, a silicon dioxide layer of 1 micron is provided to coat the principal face of a semiconductor substrate 10, for instance, of an N-type silicon. The impurity diffused regions 11a, 11b, 11c, . . . of, for instance, P+ conductivity type, have been preliminarily formed with a specified pattern of strips on the principal face. Semiconductors and insulating layers of other substances than the above-mentioned may also be used.

Then, by a known photochemical process, the insulating layer 12 is formed employing a photoresist layer 15 of about 0.5 micron thick and having openings on specified positions of said diffused regions 11a, 11b, 11c, . . . , and subsequently, the insulating layer 12 is treated by a known etchant, for instance, hydrogen peroxide solution, so that the insulating layer 12 exposed through the openings of the photoresist layer 15 is etched off to form openings 23b . . . , from which the P+ — type diffused regions 11b . . . of the semiconductor substrate 10 are exposed, as shown in FIG. 8.

Next, without removing the photoresist layer 15, a metal layer 13, for instance, aluminum layer, is vapor deposited on all of the upper face, namely, into the openings 23b, . . . and upon the photoresist layer 15, to the extent of thickness roughly equal to the thickness of the insulating layer 12, for instance, about 1 micron.

Then a known bathing of photoresist removing liquid, for instance, hot phosphoric acid solution is applied, so that the photoresist layer 15 and the part 13r of the metal layer 13 remaining upon the photoresist layer 15 are removed, while leaving the parts of the metal layer 13b, . . . embedded in the openings of the insulating layer 12 as shown in FIG. 10. As shown in FIG. 9, the vapor deposited metal layers between the lower parts 13b, . . . embedded in the opening 23b, . . , and the upper part 13r on the insulating layer 15 are as thin as 0.1 micron, and therefore, such thin inbetween layers are easily removed.

The photoresist layer 15 covered by the aluminum layer 13r can be removed very easily, since a photoresist removing liquid penetrates the porous vapor deposited metal layer 13r and dissolves the photoresist layer 15.

Thus, the openings 23b, . . . of the insulating layer 12 are filled up by the embedded metal layers 13b . . . , and the surface of the insulating layer 12 and the surface of the embedded metal 13b become almost on an even level without a prominent step remaining inbetween.

Then, again, the same metal is vapor deposited on the entire surface, and subsequently, a known etching method is effected, to leave parallel metal strips 14a, 14b, 14c, . . . , at right angles to the direction of the strips of diffused regions, as shown in FIGS. 11(a), 11(b), and 12.

Since each opening 23b, . . . is filled with metal layer 13b, . . . , the second vapor deposited metal strips 14a, 14b, 14c . . . have no prominent steps at the brim of the openings, and therefore, fragile thin parts of the metal at the brims of the steps are not produced.

Accordingly, it becomes unnecessary to provide the interconnecting metal strips 14a, 14b, 14c, . . . with side paths on both sides of the openings like the conventional ones, and therefore, the width of each metal strip can be made substantially equal to that of each opening.

Moreover, since no steps or uneven level parts are formed on the metal strips, the fragile thin parts are eliminated. Therefore, sufficient reliability of the interconnection between the diffused P+ type regions and the metal strip wirings is attainable even with a thin metal layer, and consequently, a very precise pattern of interconnecting metal strips is obtainable. Further, on account of such high precision of the pattern, the width of insulating space between the parallel metal strips can be decreased.

Since the openings 23b, . . . are filled with metal layers 13b, . . . and the upper faces of the metal layers 13b, . . . and the adjoining insulating layer 12 are on an even level, a slight deviation of locations of the metal strips from the right locations upon the openings 23b, . . . does not produce grave defects, thus resulting in easier manufacturing and higher yield.

In one example of the present invention, the width including five metal strips and their separation spaces inbetween can be made as narrow as 100 microns, while, in the conventional method, the width for the same number of metal strips and separation spaces inbetween requires about 150 microns.

Though the foregoing description is made on one example of the MOS-IC, this invention is not confined thereto, but is applicable to other types of the semiconductor devices, for instance, bi-polar type integrated circuits.

Also, this invention can be modified, for instance, to use combinations of other kind of substrates, insulating layers and vapor deposited metals.

What is claimed is:

1. Method of making an integrated circuit comprising the steps of:

forming impurity diffused regions on the principal face of a semiconductor substrate, coating the principal face of said substrate with an insulating layer, coating said insulating layer with a photoresist layer of a specified pattern having openings on specified positions thereon, etching said insulating layer through said openings by utilizing said photoresist layer as an etching mask to form openings in said insulating layer from which specified regions of said principal face of the substrate are exposed, vapor depositing a metal layer of the thickness substantially equal to the thickness of the insulating layer over the entire principal face of said substrate, to fill said openings in the insulating layer through said insulating layer and said photoresist layer, applying a photoresist removing liquid to remove said photoresist layer and the part of said metal layer that is remaining on said photoresist layer while leaving only said metal layer in said openings at a level flush with the upper surface of said insulating layer, and forming on said insulating layer metal strips having widths substantially corresponding to said openings and overlying said openings to thereby contact said metal layer formed in said openings and embed the metal layer in the openings between said specified regions of the substrate and said metal strips.

2. A method according to claim 1 wherein the semicondutor substrate is formed of silicon.

3. A method according to claim 1 wherein the insulating layer is formed of silicon dioxide.

4. A method according to claim 1 wherein the integrated circuit is a metal-oxide-semiconductor integrated circuit.

5. A method according to claim 1 wherein the vapor deposited metal layers are formed of aluminum.

6. A method according to claim 1 wherein said impurity diffused regions are formed as parallel spaced strips on said principal face.

7. A method according to claim 6 wherein said metal strips are provided in spaced parallel disposition transversely to said impurity diffused regions.

* * * * *